(12) United States Patent
Ma et al.

(10) Patent No.: US 12,730,482 B2
(45) Date of Patent: Sep. 8, 2026

(54) DISPLAY DEVICE

(71) Applicant: SAMSUNG DISPLAY CO., LTD., Yongin-si (KR)

(72) Inventors: Kitae Ma, Yongin-si (KR); Simhee Ryu, Yongin-si (KR); Kwangho Lee, Yongin-si (KR); Dongeun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 266 days.

(21) Appl. No.: 18/671,442

(22) Filed: May 22, 2024

(65) Prior Publication Data

US 2025/0165038 A1 May 22, 2025

(30) Foreign Application Priority Data

Nov. 20, 2023 (KR) ........................ 10-2023-0160304

(51) Int. Cl.
*G06F 1/16* (2006.01)
*H10K 77/10* (2023.01)
*H10K 102/00* (2023.01)

(52) U.S. Cl.
CPC .......... *G06F 1/1658* (2013.01); *H10K 77/111* (2023.02); *H10K 2102/311* (2023.02)

(58) Field of Classification Search
CPC .. G06F 1/1637; H05K 1/0271; H05K 1/0281; H05K 1/147; H10K 59/131; H10K 77/111
See application file for complete search history.

(56) References Cited

U.S. PATENT DOCUMENTS 9,285,835 B2 3/2016 Lee et al.
11,647,616 B2 5/2023 Chen et al.
11,812,594 B2 11/2023 Kim et al.
2017/0142837 A1* 5/2017 Kim ........................ H10K 59/87
2018/0151644 A1 5/2018 Han et al.
2020/0363882 A1* 11/2020 Nam ...................... H05K 1/147
2021/0126209 A1* 4/2021 Lee ........................ H10K 50/87
(Continued)

FOREIGN PATENT DOCUMENTS

EP 3564781 A1 11/2019
KR 10-2014-0108827 A 9/2014
(Continued)

OTHER PUBLICATIONS

Extended European Search Report dated Mar. 31, 2025 in corresponding European Patent Application No. 24212963.3, 7 pages.

*Primary Examiner* — Nathan Milakovich
(74) *Attorney, Agent, or Firm* — F. CHAU & ASSOCIATES, LLC

(57) ABSTRACT

A display device includes a substrate that includes a first area, a second area spaced apart from the first area, and a bendable area that connects the first area to the second area, a support substrate disposed below the substrate and that supports the substrate, a display portion disposed in the first area of the substrate, a first circuit board connected to the second area of the substrate and that includes a flexible film, a second circuit board connected to the first circuit board, and a rigid reinforcement portion that connects the second area of the substrate to the second circuit board and covers the first circuit board.

22 Claims, 9 Drawing Sheets

(56) References Cited

U.S. PATENT DOCUMENTS

| | | | | |
|---|---|---|---|---|
| 2022/0131107 | A1* | 4/2022 | Shin | H10K 59/131 |
| 2022/0164002 | A1 | 5/2022 | An et al. | |
| 2022/0336714 | A1 | 10/2022 | Kim | |

FOREIGN PATENT DOCUMENTS

| | | | |
|---|---|---|---|
| KR | 10-2021-0080945 | A | 7/2021 |
| KR | 10-2022-0143208 | A | 10/2022 |
| KR | 10-2023-0091845 | A | 6/2023 |

* cited by examiner

FIG. 6

DP 1A BA 2A CV POL TS 60 ELS BPL FP FP1 FP2 ST 52 41 51 10a-1 10a-2 10a-3 10a 10b 1 80 Z Y X

DISPLAY DEVICE

CROSS-REFERENCE TO RELATED APPLICATION

This application claims priority under 35 U.S.C. § 119 from Korean Patent Application No. 10-2023-0160304, filed on Nov. 20, 2023 in the Korean Intellectual Property Office, the contents of which are herein incorporated by reference in their entirety.

TECHNICAL FIELD

One or more embodiments are directed to a device, and more particularly, to a display device.

DISCUSSION OF THE RELATED ART

Mobile electronic devices are widely used. Mobile electronic devices include, in addition to small electronic devices such as mobile phones, tablet personal computers (PCs), which have been widely used in recent years.

Such mobile electronic devices include display devices that provide various functions, such as providing visual information, such as images or videos, to users. As components that drive display devices have been miniaturized, the proportion occupied by a display device in an electronic device has been gradually increasing. Structures that can be bent from a flat state to bent state are also under development.

SUMMARY

One or more embodiments include a display device that includes a reinforcement portion that reinforces a first circuit board and provides a space in which a fixing portion with a vacuum pad can be fixed.

According to one or more embodiments, a display device includes a substrate that includes a first area, a second area spaced apart from the first area, and a bendable area that connects the first area to the second area, a support substrate disposed below the substrate and that supports the substrate, a display portion disposed in the first area of the substrate, a first circuit board connected to the second area of the substrate and that includes a flexible film, a second circuit board connected to the first circuit board, and a rigid reinforcement portion that connects the second area of the substrate to the second circuit board and covers the first circuit board and having rigidity.

In an embodiment, the reinforcement portion is spaced apart from the first circuit board.

In an embodiment, the display device further includes a display driver disposed between the first circuit board and the reinforcement portion and connected to the first circuit board.

In an embodiment, a cross-sectional shape of the reinforcement portion has a '⊏' shape.

In an embodiment, one surface of the reinforcement portion includes a flat surface.

In an embodiment, one side of the reinforcement portion is fixed to the second area of the substrate, and another side of the reinforcement portion is fixed to the second circuit board.

In an embodiment, the reinforcement portion includes at least one of a steel use stainless (SUS), a polyethylene terephthalate (PET), graphite, or a copper (CU) material.

In an embodiment, the display device furthers include a bending protection layer disposed in the bendable area of the substrate.

In an embodiment, the support substrate includes a first support substrate that supports the first area of the substrate, a second support substrate that supports the second area of the substrate, and an opening that overlaps the bendable area of the substrate.

In an embodiment, the display device further includes a protection member that, when the bendable area of the substrate is in a bent state, is arranged between the first support substrate and the second support substrate.

According to one or more embodiments, a display device includes a display panel, a first circuit board connected to the display panel and that includes a flexible film, a second circuit board connected to the first circuit board, and a rigid reinforcement portion that reinforces the first circuit board. The display panel includes a substrate that includes a first area, a second area spaced apart from the first area and connected to the first circuit board, and a bendable area that connects the first area to the second area, a support substrate disposed below the substrate and that supports the substrate, and a display portion disposed in the first area of the substrate.

In an embodiment, the reinforcement portion is spaced apart from the first circuit board.

In an embodiment, the display device further includes a display driver disposed between the first circuit board and the reinforcement portion and connected to the first circuit board.

In an embodiment, a cross-sectional shape of the reinforcement portion has a 'C' shape.

In an embodiment, one surface of the reinforcement portion includes a flat surface.

In an embodiment, one side of the reinforcement portion is fixed to the second area of the substrate, and another side of the reinforcement portion is fixed to the second circuit board.

In an embodiment, the reinforcement portion includes at least one of a steel use stainless (SUS), a polyethylene terephthalate (PET), graphite, or a copper (CU) material.

In an embodiment, the display device further includes a bending protection layer disposed in the bendable area of the substrate.

In an embodiment, the support substrate includes a first support substrate that supports the first area of the substrate, a second support substrate that supports the second area of the substrate, and an opening that overlaps the bendable area of the substrate.

In an embodiment, the display device further includes a protection member that, when the bendable area of the substrate is in a bent state, is arranged between the first support substrate and the second support substrate.

According to one or more embodiments, a display device includes a substrate that includes a first area, a second area spaced apart from the first area, and a bendable area that connects the first area to the second area; a first circuit board connected to the second area of the substrate and including a flexible film; a second circuit board connected to the first circuit board; and a rigid reinforcement portion that connects the second area of the substrate to the second circuit board and covers the first circuit board. One side of the reinforcement portion is fixed to the second area of the substrate, and another side of the reinforcement portion is fixed to the second circuit board.

In an embodiment, the display device further includes a support substrate disposed below the substrate and that supports the substrate; a bending protection layer disposed in the bendable area of the substrate; and a display portion disposed in the first area of the substrate. The support substrate includes a first support substrate that supports the first area of the substrate; a second support substrate that supports the second area of the substrate; and an opening that overlaps the bendable area of the substrate.

Other aspects, features, and advantages of the disclosure will become better understood through the accompanying drawings, the appended claims, and the detailed description.

BRIEF DESCRIPTION OF THE DRAWINGS

FIG. 6 is a schematic cross-sectional view of a display device according to an embodiment.

DETAILED DESCRIPTION

Figure 1:
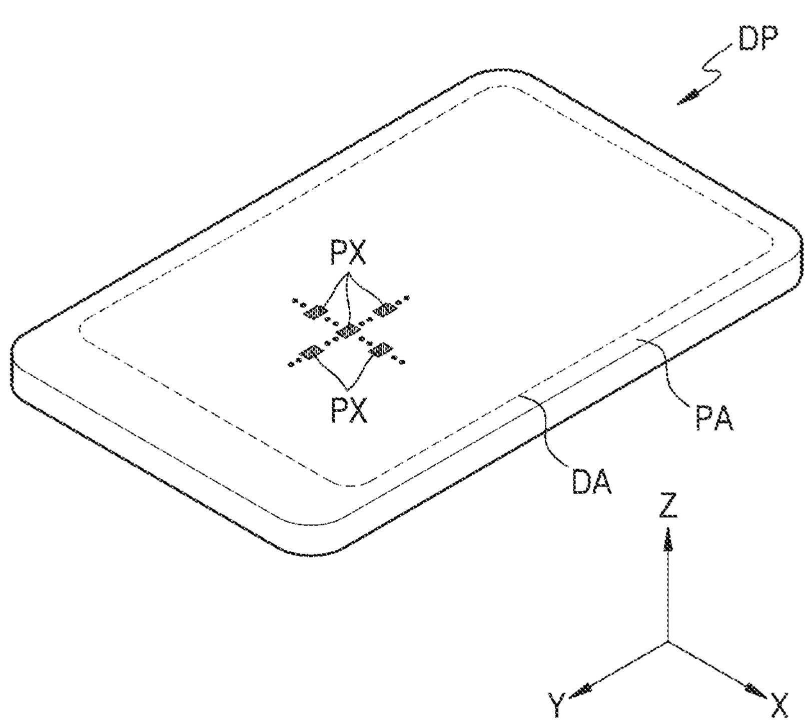
FIG. 1 is a schematic perspective view of a display device according to an embodiment.

Reference will now be made in detail to embodiments, examples of which are illustrated in the accompanying drawings, wherein like reference numerals may refer to like elements throughout. In this regard, embodiments can have different forms and should not be construed as being limited to the descriptions set forth herein.

Hereinafter, embodiments will be described in detail with reference to the accompanying drawings. When describing embodiments with reference to the accompanying drawings, the same or corresponding elements may be denoted by the same reference numerals, and redundant descriptions thereof are omitted.

It will be further understood that, when a layer, region, or element is referred to as being “on” another layer, region, or element, this may be directly on the other layer, region, or element, but also intervening layers, regions, or elements may be present therebetween.

The X-axis, the Y-axis, and the Z-axis are not limited to three axes of the rectangular coordinate system and may be interpreted in a broader sense. For example, the X-axis, the Y-axis, and the Z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the stated order.

FIG. 1 is a schematic perspective view of a display device DP according to an embodiment.

Referring of FIG. 1, in an embodiment, the display device DP includes a display area DA and a peripheral area PA outside the display area DA. The display device DP provides an image through an array of a plurality of pixels PX arranged two-dimensionally in rows and columns in the display area DA. Each of the pixels PX has an emission area in which a light-emitting element driven by a pixel circuit emits light. For example, an image is provided by light that the light-emitting element emits through the pixel PX. Because an area where an image is provided is determined by the arrangement of the light-emitting elements, the display area DA is defined by the light-emitting elements. In addition to the light-emitting elements and pixel circuits that drive the light-emitting elements, various signal lines and power lines electrically connected to the pixel circuits are arranged in the display area DA.

The peripheral area PA is an area in which no image is provided and may completely or partially surround the display area DA. Various lines and driving circuits that provide electrical signals or power to the display area DA are arranged in the peripheral area PA.

The display device DP has an approximately rectangular shape when viewed from a direction perpendicular to the top surface of the display device DP. For example, as illustrated in FIG. 1, the display device DP has a rectangular planar shape as a whole that has a short side that extends in a first direction, such as an X-axis direction, and a long side that extends in a second direction, such as a Y-axis direction. A corner at which the short side in the first direction (the X-axis direction) meets the long side in the second direction (the Y-axis direction) may have a right-angled shape, or may have a rounded shape with a predetermined curvature, as illustrated in FIG. 1. The planar shape of the display device DP is not limited to a rectangular shape and may have various other shapes, such as a polygonal shape, such as a triangular shape, a circular shape, an elliptical shape, or an irregular shape.

Hereinafter, in an embodiment, the display device DP includes an organic light-emitting diode (OLED) as a light-emitting element, but embodiments of the disclosure are not necessarily limited thereto. For example, in some embodiments, the display device DP includes an inorganic light-emitting diode or a quantum dot light-emitting diode as a light-emitting element.

The display device DP can be used as a display screen of a portable electronic device, such as a mobile phone, a smartphone, a tablet personal computer (PC), a mobile communication terminal, an electronic organizer, an e-book, a portable multimedia player (PMPs), a navigation system, and an ultra mobile PC (UMPC). In addition, the display device DP can be used as a display screen for various products, such as a television, a laptop, a monitor, a billboard, and an Internet of things (IoT) device. The display device DP according to an embodiment can also be used in a wearable device, such as a smart watch, a watch phone, a glasses-type display, and a head mounted display (HMD). The display device DP according to an embodiment can also be used in the dashboard of an automobile, a center information display (CIDs) on the center fascia or dashboard of an automobile, a room mirror display that replaces side mirrors of an automobile, and a display screen on the rear sides of front seats to serve as entertainment devices for backseat passengers of an automobile. For convenience of explanation, an embodiment in which the display device DP is used in a smartphone is described.

Figure 2:
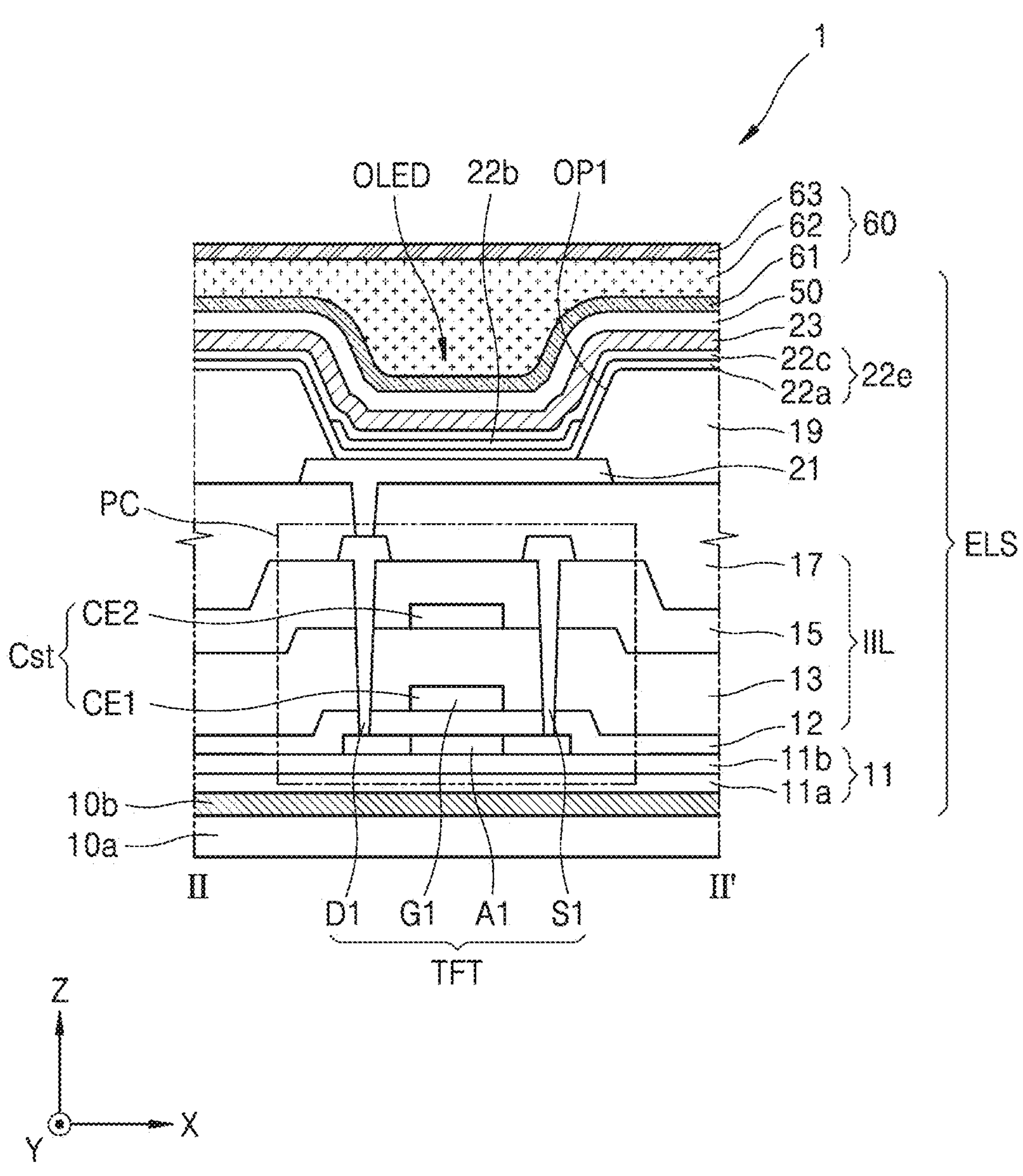
FIG. 2 is a cross-sectional view of a portion of a display panel of a display device illustrated in FIG. 1, according to an embodiment.

FIG. 2 is a cross-sectional view of a display panel 1 of the display device DP illustrated in FIG. 1, according to an embodiment.

Referring to FIGS. 1 and 2, in an embodiment, the display panel 1 include a support substrate 10*a*, a substrate 10*b*, a display portion ELS, and an encapsulation layer 60.

The support substrate 10*a* includes an insulating material, such as glass and/or quartz. The support substrate 10*a* may include portions that are separated from each other. For example, the support substrate 10*a* may be separated into two or three pieces.

The substrate 10*b* is disposed on the support substrate 10*a* and includes an insulating material, such as a polymer resin. For example, the substrate 10*b* is a flexible substrate that is bendable, foldable, or rollable. When the substrate 10*b* includes an insulating material, such as a polymer resin, the substrate 10*b* has a structure in which layers that include an organic material and layers that include an inorganic material are alternately stacked. For example, the substrate 10*b* includes an organic layer that includes at least one of polyimide, polyethylene naphthalate, polyethylene terephthalate, polyarylate, polycarbonate, polyetherimide, or polyethersulfone, and an inorganic material layer that includes at least one of silicon oxide, silicon oxynitride, silicon nitride, or amorphous silicon.

The display portion ELS is disposed on the substrate 10*b*. The display portion ELS includes a buffer layer 11, a pixel circuit PC, an insulating layer IIL, a pixel defining layer 19, a pixel electrode 21, an emission layer 22*b*, an organic functional layer 22*e*, an opposite electrode 23, and an upper layer 50.

The buffer layer 11 is disposed on the substrate 10*b*. The buffer layer 11 reduces or prevents infiltration of foreign materials, moisture, or ambient air from below the substrate 10*b* and provides a flat surface on the substrate 10*b*. The buffer layer 11 may include an inorganic material, such as an oxide or a nitride, an organic material, or an organic/inorganic composite material and may have a single-layer or multilayer structure that includes an inorganic material and an organic material. A barrier layer that prevents infiltration of ambient air may be further included between the substrate 10*b* and the buffer layer 11. In some embodiments, the buffer layer 11 includes silicon oxide ($SiO_2$) or silicon nitride ($SiN_x$). The buffer layer 11 includes a first buffer layer 11*a* and a second buffer layer 11*b* that are sequentially stacked in this stated order.

The pixel circuit PC and the insulating layer IIL are disposed on the buffer layer 11. The pixel circuit PC includes a thin-film transistor TFT and a storage capacitor Cst. In addition, the insulating layer IIL includes a first gate insulating layer 12, a second gate insulating layer 13, an interlayer insulating layer 15, and a planarization layer 17.

The thin-film transistor TFT, which is connected to an organic light-emitting element and configured to drive the organic light-emitting element, is disposed on the buffer layer 11. The thin-film transistor TFT includes a first semiconductor layer A1, a first gate electrode G1, a first source electrode S1, and a first drain electrode D1.

The first semiconductor layer A1 is disposed on the buffer layer 11 and may include polysilicon. In another embodiment, the first semiconductor layer A1 includes amorphous silicon. In another embodiment, the first semiconductor layer A1 includes an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The first semiconductor layer A1 includes a channel region, and a source region and a drain region doped with impurities.

The first gate insulating layer 12 is disposed on the buffer layer 11 and covers the first semiconductor layer A1. The first gate insulating layer 12 includes an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be ZnO and/or $ZnO_2$. The first gate insulating layer 12 may have a single layer or include multiple layers that include one or more of the inorganic insulating material described above.

The first gate electrode G1 is disposed on the first gate insulating layer 12 and overlaps the first semiconductor layer A1. The first gate electrode G1 includes at least one of molybdenum (Mo), aluminum (Al), copper (Cu), or titanium (Ti), etc., and may have a single layer or include multiple layers. For example, the first gate electrode G1 is a single Mo layer.

The second gate insulating layer 13 is disposed on the first gate insulating layer 12 and covers the first gate electrode G1. The second gate insulating layer 13 includes an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be ZnO and/or $ZnO_2$. The second gate insulating layer 13 may have a single layer or include multiple layers that include one or more of the inorganic insulating materials described above.

A first upper electrode CE2 of the storage capacitor Cst is disposed on the second gate insulating layer 13.

In the display area DA, the first upper electrode CE2 overlaps the first gate electrode G1 therebelow. The first gate electrode G1 and the first upper electrode CE2 that overlap each other with the second gate insulating layer 13 therebetween constitute the storage capacitor Cst. The first gate electrode G1 is a first lower electrode CE1 of the storage capacitor Cst.

The first upper electrode CE2 includes at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or include multiple layers that include one or more of the materials described above.

The interlayer insulating layer 15 is disposed on the second gate insulating layer 13 and covers the first upper electrode CE2. The interlayer insulating layer 15 includes at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The interlayer insulating layer 15 may have a single layer or include multiple layers that include one or more of the inorganic insulating materials described above. The zinc oxide ($ZnO_x$) may be ZnO and/or $ZnO_2$.

The first source electrode S1 and the first drain electrode D1 are disposed on the interlayer insulating layer 15. The first source electrode S1 and the first drain electrode D1 each include a conductive material that includes at least one of molybdenum (Mo), aluminum (Al), copper (Cu), or titanium (Ti), etc., may each have a single layer or include multiple layers that include one or more of the conductive materials described above. For example, the first source electrode S1 and the first drain electrode D1 each has a multilayer structure of Ti/Al/Ti.

The planarization layer 17 is disposed on the interlayer insulating layer 15 and covers the first source electrode S1 and the first drain electrode D1. The planarization layer 17 has a flat upper surface so that the pixel electrode 21 disposed thereon is flat.

The planarization layer 17 may include an organic material or an inorganic material and may have a single-layer or a multilayer structure. In an embodiment, the planarization layer 17 includes at least one of a general-purpose polymer, such as benzocyclobutene (BCB), polyimide, hexamethyldisiloxane (HMDSO), polymethylmethacrylate (PMMA), or polystyrene (PS), polymer derivatives that include a phenolic group, an acrylic polymer, an imide-based polymer, an aryl ether-based polymer, an amide-based polymer, a fluorine-based polymer, a p-xylene-based polymer, or a vinyl alcohol-based polymer. In an embodiment, the planarization layer 17 includes an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be ZnO and/or $ZnO_2$. When the planarization layer 17 is formed, a layer is formed, and then, chemical mechanical polishing is performed on the upper surface of the layer to provide a flat upper surface.

The planarization layer 17 has a via hole that exposes one of the first source electrode S1 or the first drain electrode D1 of the thin-film transistor TFT, and the pixel electrode 21 is in contact with one of the first source electrode S1 or the first drain electrode D1 through the via hole and is electrically connected to the thin-film transistor TFT.

The pixel electrode 21 includes a conductive oxide, such as at least one of indium tin oxide (ITO), indium zinc oxide (IZO), zinc oxide (ZnO), indium oxide ($In_2O_3$), indium gallium oxide (IGO), or aluminum zinc oxide (AZO). The pixel electrode 21 may include a reflection layer that includes at least one of silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the pixel electrode 21 has a multi-layer structure that includes at least one of ITO, IZO, ZnO, or $In_2O_3$ above/below the reflection layer. For example, the pixel electrode 21 has a stack structure of ITO/Ag/ITO.

The pixel defining layer 19 is disposed on the on the planarization layer 17 and covers an edge of the pixel electrode 21 on the planarization layer 17, and includes a first opening OP1 that exposes a central portion of the pixel electrode 21. The size and shape of the emission area of the organic light-emitting element is defined by the first opening OP1.

The pixel defining layer 19 prevents an electric arc, etc., from occurring on the edge of the pixel electrode 21 by increasing the distance between the edge of the pixel electrode 21 and the opposite electrode 23. The pixel defining layer 19 includes an organic insulating material, such as at least one of polyimide, polyamide, acrylic resin, BCB, HMDSO, or phenol resin, and can be formed by spin coating.

The emission layer 22*b* that corresponds to the pixel electrode 21 is disposed in the first opening OP1 of the pixel defining layer 19. The emission layer 22*b* includes a high molecular weight material or a low molecular weight material and emits one of red light, green light, blue light, or white light.

The organic functional layer 22*e* is disposed above and/or below the emission layer 22*b*. The organic functional layer 22*e* includes a first functional layer 22*a* and/or a second functional layer 22*c*. One of the first functional layer 22*a* or the second functional layer 22*c* may be omitted.

The first functional layer 22*a* is disposed below the emission layer 22*b*. The first functional layer 22*a* may be a single layer or include multiple layers that include an organic material. In an embodiment, the first functional layer 22*a* is a hole transport layer (HTL) that has a single-layer structure. In an embodiment, the first functional layer 22*a* includes a hole injection layer (HIL) and an HTL. In an embodiment, the first functional layer 22*a* is integrally formed and corresponds to the organic light-emitting elements in the display area DA.

The second functional layer 22*c* is disposed on the emission layer 22*b*. The second functional layer 22*c* may be a single layer or include multiple layers that include an organic material. The second functional layer 22*c* may include an electron transport layer (ETL) and/or an electron injection layer (EIL). The second functional layer 22*c* is integrally formed and corresponds to the organic light-emitting elements in the display area DA.

The opposite electrode 23 is disposed on the second functional layer 22*c*. The opposite electrode 23 includes a conductive material that has a low work function. For example, the opposite electrode 23 includes a (semi) transparent layer that includes at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In an embodiment, the opposite electrode 23 further includes a layer that includes at least one of ITO, IZO, ZnO, or $In_2O_3$ on the (semi) transparent layer. The opposite electrode 23 is integrally formed and corresponds to the organic light-emitting elements in the display area DA.

The layers formed in the display area DA, from the pixel electrode 21 to the opposite electrode 23, constitute an organic light-emitting element. In an embodiment, the organic light-emitting element is an organic light-emitting element diode (OLED).

The upper layer 50 includes an organic material and is disposed on the opposite electrode 23. The upper layer 50 protects the opposite electrode 23 and increases light extraction efficiency. The upper layer 50 includes an organic material that has a refractive index higher than that of the opposite electrode 23. In an embodiment, the upper layer 50 includes stacked layers that have different refractive indices from each other. For example, the upper layer 50 includes a high refractive index layer, a low refractive index layer, and a high refractive index layer that are sequentially stacked. For example, the refractive index of the high refractive index layer is 1.7 or more and the refractive index of the low refractive index layer is 1.3 or less.

The upper layer 50 further includes LiF. In an embodiment, the upper layer 50 further includes an inorganic insulating material such as silicon oxide ($SiO_2$) or silicon nitride ($SiN_x$). In an embodiment, the upper layer 50 is omitted when necessary. However, for convenience of explanation, an embodiment in which the upper layer 50 is disposed on the opposite electrode 23 is described in detail.

The display device DP includes an encapsulation member that shields the upper layer 50. For example, the encapsulation member includes the encapsulation layer 60 that shields the upper layer 50.

The encapsulation layer 60 is in direct contact with the upper layer 50. The encapsulation layer 60 covers a portion of the display area DA and the peripheral area NDA and prevents infiltration of external moisture and/or oxygen. The encapsulation layer 60 includes at least one organic encapsulation layer and at least one inorganic encapsulation layer. For convenience of explanation, an embodiment in which the encapsulation layer 60 includes a first inorganic encapsulation layer 61, an organic encapsulation layer 62, and a second inorganic encapsulation layer 63 that are sequentially stacked on the upper layer 50 is described in detail.

For example, the first inorganic encapsulation layer 61 covers the upper layer 50 and includes at least one of silicon oxide, silicon nitride, and/or silicon oxynitride. Because the first inorganic encapsulation layer 61 conforms to the structure therebelow, the upper surface of the first inorganic encapsulation layer 61 may not be flat. The organic encapsulation layer 62 covers the first inorganic encapsulation layer 61. Unlike the first inorganic encapsulation layer 61, the upper surface of the organic encapsulation layer 62 is substantially flat. For example, the organic encapsulation layer 62 has a substantially flat upper surface in the display area DA. The organic encapsulation layer 62 includes at least one of polyethylene terephthalate, polyethylene naphthalate, polycarbonate, polyimide, polyethylene sulfonate, polyoxymethylene, polyarylate, or HMDSO. The second inorganic encapsulation layer 63 covers the organic encapsulation layer 62 and includes at least one of silicon oxide, silicon nitride, and/or silicon oxynitride.

Figure 3:
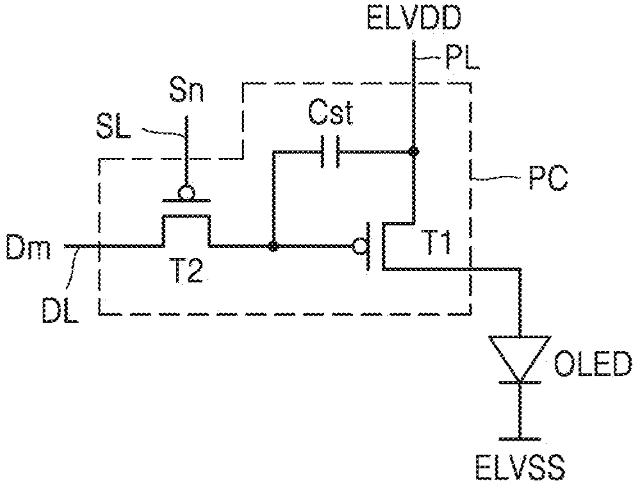
FIGS. 3 to 5 are circuit diagrams of a display panel illustrated in FIG. 2, according to an embodiment.
Figure 4:
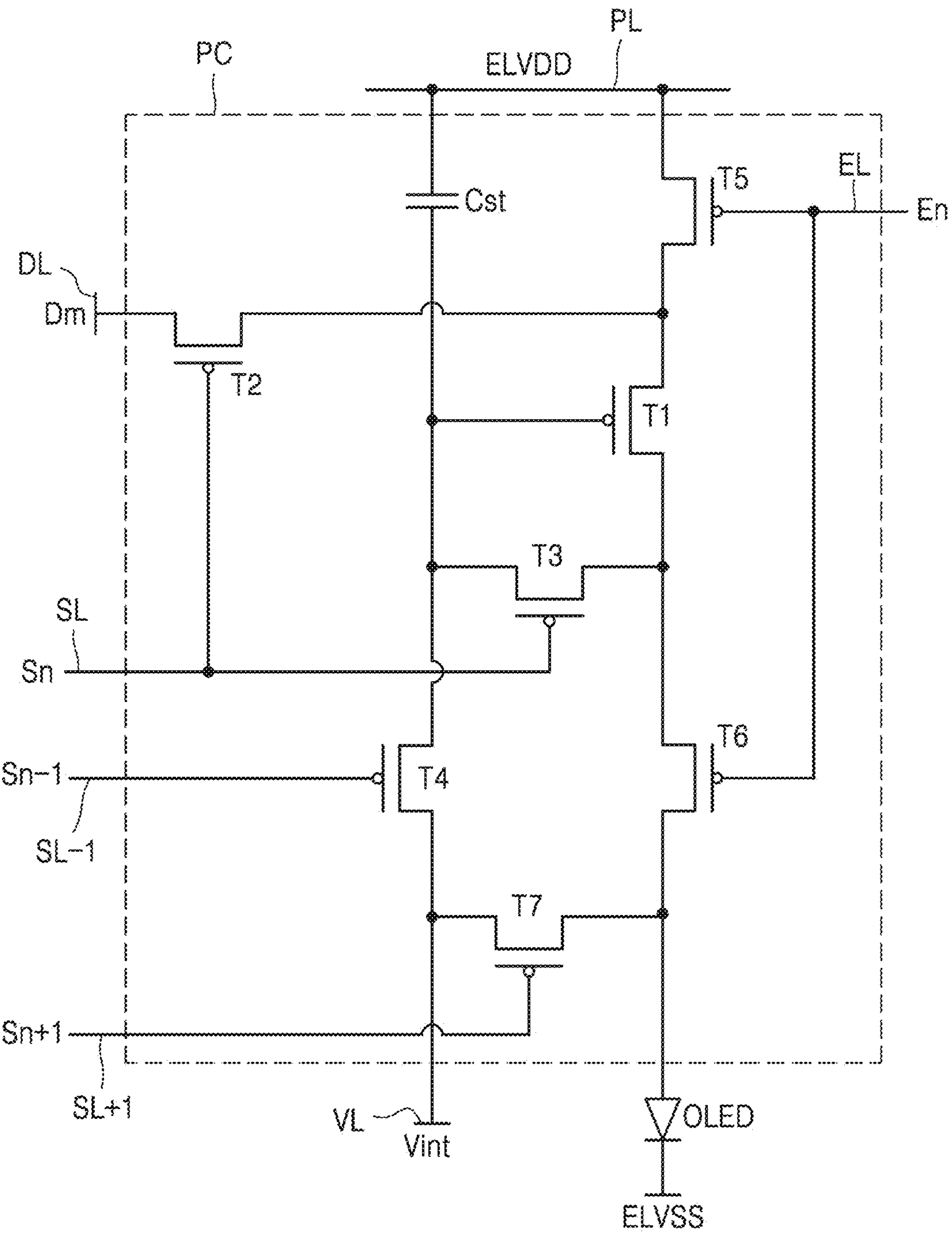
Figure 5:
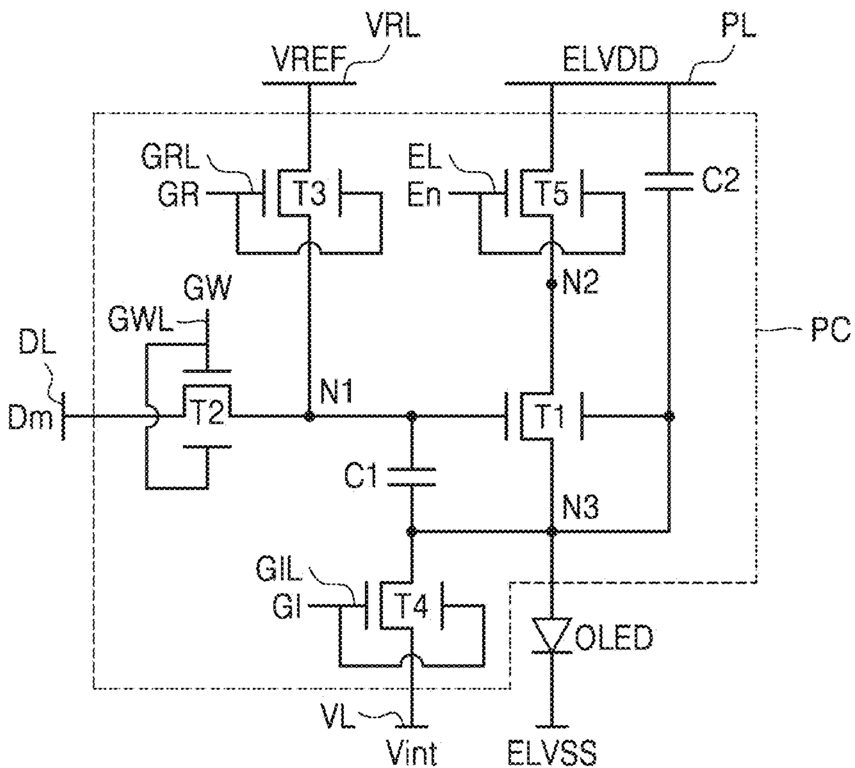

FIGS. 3 to 5 are circuit diagrams of the display panel 1 illustrated in FIG. 2, according to an embodiment.

Referring to FIGS. 3 to 5, in an embodiment, the pixel circuit PC is connected to a light-emitting element to control the emission of light from the pixels. For example, the light-emitting element includes the organic light-emitting element illustrated in FIG. 2. The pixel circuit PC includes a driving thin-film transistor T1, a switching thin-film transistor T2, and a storage capacitor Cst. The switching thin-film transistor T2 is connected to a scan line SL and a data line DL and transmits to the driving thin-film transistor T1 a data signal Dm received through the data line DL in response to a scan signal Sn received through the scan line SL.

The storage capacitor Cst is connected to the switching thin-film transistor T2 and a driving voltage line PL and stores a voltage that corresponds to a difference between a voltage received from the switching thin-film transistor T2 and a driving voltage ELVDD received through the driving voltage line PL.

The driving thin-film transistor T1 is connected to the driving voltage line PL and the storage capacitor Cst and controls a driving current that flows from the driving voltage line PL to the light-emitting element according to a voltage value stored in the storage capacitor Cst. The light-emitting element emits light having a luminance according to the driving current.

Although FIG. 3 illustrates that the pixel circuit PC includes two thin-film transistors and one storage capacitor, the disclosure is not limited thereto.

Referring to FIG. 4, in an embodiment, the pixel circuit PC includes a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

Although FIG. 4 illustrates an embodiment in which signal lines SL, SL−1, SL+1, EL, and DL, an initialization voltage line VL, and a driving voltage line PL are provided for each pixel circuit PC, embodiments of the disclosure are not necessarily limited thereto. In another embodiment, the initialization voltage line VL and/or at least one of the signal lines SL, SL−1, SL+1, EL, and DL are shared by neighboring pixel circuits.

A drain electrode of the driving thin-film transistor T1 is electrically connected to a light-emitting element via the emission control thin-film transistor T6. The driving thin-film transistor T1 receives a data signal Dm according to the switching operation of the switching thin-film transistor T2 and supplies a driving current to the light-emitting element.

A gate electrode of the switching thin-film transistor T2 is connected to the scan line SL and a source electrode of the switching thin-film transistor T2 is connected to the data line DL. A drain electrode of the switching thin-film transistor T2 is connected to a source electrode of the driving thin-film transistor T1 and connected to the driving voltage line PL via the operation control thin-film transistor T5.

The switching thin-film transistor T2 is turned on in response to a scan signal Sn received through the scan line SL and performs a switching operation that transmits the data signal Dm from the data line DL to the source electrode of the driving thin-film transistor T1.

A gate electrode of the compensation thin-film transistor T3 is connected to the scan line SL. A source electrode of the compensation thin-film transistor T3 is connected to the drain electrode of the driving thin-film transistor T1 and connected to a pixel electrode of the light-emitting element via the emission control thin-film transistor T6. A drain electrode of the compensation thin-film transistor T3 is connected to one electrode of the storage capacitor Cst, a source electrode of the first initialization thin-film transistor T4, and a gate electrode of the driving thin-film transistor T1. The compensation thin-film transistor T3 is turned on in response to the scan signal Sn received through the scan line SL and connects the gate electrode of the driving thin-film transistor T1 to the drain electrode of the driving thin-film transistor T1. Therefore, the compensation thin-film transistor T3 is diode-connected.

A gate electrode of the first initialization thin-film transistor T4 is connected to the previous scan line SL−1. A drain electrode of the first initialization thin-film transistor T4 is connected to the initialization voltage line VL. The source electrode of the first initialization thin-film transistor T4 is connected to one electrode of the storage capacitor Cst, the source electrode of the compensation thin-film transistor T3, and the gate electrode of the driving thin-film transistor T1. The first initialization transistor T4 is turned on in response to a previous scan signal Sn−1 received through the previous scan SL−1 and performs an initialization operation of transmitting an initialization voltage Vint1 to the driving transistor T1 to initialize the voltage of the driving gate of the driving transistor T1.

A gate electrode of the operation control thin-film transistor T5 is connected to the emission control line EL. A source electrode of the operation control thin-film transistor T5 is connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 is connected to the emission control line EL. A source electrode of the emission control thin-film transistor T6 is connected to the drain electrode of the driving thin-film transistor T1 and the source electrode of the compensation thin-film transistor T3. A drain electrode of the emission control thin-film transistor T6 is electrically connected to the pixel electrode of the light-emitting element. The operation control thin-film transistor T5 and the emission control thin-film transistor T6 are simultaneously turned on in response to an emission control signal En received through the emission control line EL and transmit a driving voltage ELVDD to the light-emitting element, so that a driving current flows to the light-emitting element.

A gate electrode of the second initialization thin-film transistor T7 is connected to the next scan line SL+1. A source electrode of the second initialization thin-film transistor T7 is connected to the pixel electrode of the light-emitting element. A drain electrode of the second initialization thin-film transistor T7 is connected to the initialization voltage line VL. The second initialization thin-film transistor T7 is turned on in response to a next scan signal Sn+1 received through the next scan line SL+1 and initializes the pixel electrode of the light-emitting element.

Although FIG. 4 illustrates that the first initialization thin-film transistor T4 and the second initialization thin-film transistor T7 are respectively connected to the previous scan line SL−1 and the next scan line SL+1, embodiments of the disclosure are not necessarily limited thereto. In another embodiment, both the first initialization thin-film transistor T4 and the second initialization thin-film transistor T7 are connected to the previous scan line SLn−1 and are driven in response to the previous scan signal Sn−1.

The other electrode of the storage capacitor Cst is connected to the driving voltage line PL. One electrode of the storage capacitor Cst is connected to the gate electrode of the driving thin-film transistor T1, the drain electrode of the compensation thin-film transistor T3, and the source electrode of the first initialization thin-film transistor T4.

An opposite electrode, such as a cathode, of the light-emitting element receives a common voltage ELVSS. The light-emitting element emits light by receiving the driving current from the driving thin-film transistor T1.

Referring to FIG. 5, in an embodiment, a pixel circuit PC includes first to fifth transistors T1 to T5 and first and second capacitors C1 and C2. The first transistor T1 is a driving transistor in which an amount of a source-drain current is determined according to a gate-source voltage, and the second to fifth transistors T2 to T5 are each a switching transistor that can be turned on or off according to a gate-source voltage, such as a gate voltage. The first to fifth transistors T1 to T5 are each implemented as a thin-film transistor. Depending on the type (p-type or n-type) and/or operating conditions of each transistor, a first terminal of each of the first to fifth transistors T1 to T5 is a source or a drain and a second terminal thereof differs from the first terminal. For example, when the first terminal is a source, the second terminal is a drain.

A driving voltage line PL transmits a driving voltage FP to the first transistor T1. An initialization voltage line VL transmits an initialization voltage Vint to an organic light-emitting diode OLED. A reference voltage line VRL transmits a reference voltage VREF to a gate of the first transistor T1.

The first to fifth transistors T1 to T5 each include an oxide semiconductor. Because an oxide semiconductor has a high carrier mobility and a low leakage current, the voltage drop is not great even when the driving time is long. For example, for an oxide semiconductor, low-frequency driving is possible because the color change of an image according to a voltage drop is not great even during low-frequency driving. Because the first to fifth transistors T1 to T5 each include an oxide semiconductor, a display device can be implemented that prevents a leakage current i and reduces power consumption. In addition, by using an oxide semiconductor transistor, it is unnecessary to perform a crystallization process using excimer laser annealing (ELA) to form a low-temperature polycrystalline silicon (LTPS) semiconductor transistor. Accordingly, a manufacturing cost of the display panel is reduced, and a large-area display device can be implemented.

Because an oxide semiconductor is sensitive to light, the amount of current, etc., can change due to external light. Accordingly, external light is absorbed or reflected by disposing a metal layer below the oxide semiconductor. The metal layer below the oxide semiconductor of each of the first to fifth transistors T1 to T5 functions as a lower gate, such as a gate electrode. For example, each of the first to fifth transistors T1 to T5 is a double gate transistor that has two gates, a first gate and a second gate. The first gate and the second gate are disposed on different layers and face each other. For example, each of the first to fifth transistors T1 to T5 is an N-channel oxide semiconductor transistor, and the first gate and the second gate of each of the first to fifth transistors T1 to T5 face each other with the oxide semiconductor therebetween.

The first transistor T1 includes a first gate connected to a first node N1, a second gate connected to a third node N3, a first terminal connected to a second node N2, and a second terminal connected to the third node N3. The second gate of the first transistor T1 is connected to the second terminal of the first transistor T1 and is controlled by a voltage applied to the second terminal of the first transistor T1, and increases output saturation characteristics of the first transistor T1. The first terminal of the first transistor T1 is connected to the driving voltage line PL via the fifth transistor T5, and the second terminal of the first transistor T1 is connected to the pixel electrode of the organic light-emitting diode OLED. The first transistor T1, which acts as a driving transistor, receives a data signal Dm according to the switching operation of the second transistor T2 and controls an amount of a driving current that flows to the organic light-emitting diode OLED.

The second transistor T2, which acts as a data write transistor, includes a first gate and a second gate connected to a first scan line GWL, a first terminal connected to a data line DL, and a second terminal connected to the first node N1, or the gate of the first transistor T1. The second transistor T2 is turned on in response to a first scan signal GW received through the first scan line GWL and electrically connects the data line DL to the first node N1 so that the data signal Dm received through the data line DL is transmitted to the first node N1.

The third transistor T3, which acts as a first initialization transistor, includes a first gate and a second gate connected to a third scan line GRL, a first terminal connected to the reference voltage line VRL, and a second terminal connected to the first node N1, or the gate of the first transistor T1. The third transistor T3 is turned on in response to a third scan signal GR received through the third scan line GRL and transmits, to the first node N1, a reference voltage VREF received through the reference voltage line VRL.

The fourth transistor T4, which acts as a second initialization transistor, includes a first gate and a second gate connected to a second scan line GIL, a first terminal connected to the third node N3, or the second terminal of the first transistor T1, and a second terminal connected to an initialization voltage line VL. The fourth transistor T4 is turned on in response to a second scan signal GI received through the second scan line GIL and transmits, to the third node N3, an initialization voltage Vint received through the initialization voltage line VL.

The fifth transistor T5, which acts as an emission control transistor, includes a first gate and a second gate connected to an emission control line EL, a first terminal connected to the driving voltage line PL, and a second terminal connected to the second node N2, or the first terminal of the first transistor T1. The fifth transistor T5 is turned on or off in response to an emission control signal En received through the emission control line EL.

The first capacitor C1 is connected between the first node N1 and the third node N3. A first terminal of the first capacitor C1 is connected to the first gate of the first transistor T1, and a second terminal of the first capacitor C1 is connected to the second gate and the second terminal of the first transistor T1, the first terminal of the fourth transistor T4, and the pixel electrode of the organic light-emitting diode OLED. The first capacitor C1, which acts as a storage capacitor, stores a voltage that corresponds to a data signal and a threshold voltage of the first transistor T1.

The second capacitor C2 is connected between the third node N3 and the driving voltage line PL. A first terminal of the second capacitor C2 is connected to the driving voltage line PL, and a second terminal of the second capacitor C2 is connected to the second gate and the second terminal of the first transistor T1, the second terminal of the first capacitor C1, the first terminal of the fourth transistor T4, and the pixel electrode of the organic light-emitting diode OLED. The capacity of the first capacitor C1 is greater than the capacity of the second capacitor C2.

The organic light-emitting diode OLED includes the pixel electrode (the anode) and the opposite electrode (the cathode) that faces the pixel electrode, and the opposite electrode receives a common voltage ELVSS.

The pixel circuit PC is not necessarily limited to the number and circuit design of the thin-film transistors and the storage capacitor described with reference to FIGS. 3 to 5, and the number and circuit design of the thin-film transistors and the storage capacitor can be variously modified in other embodiments.

Figure 6:
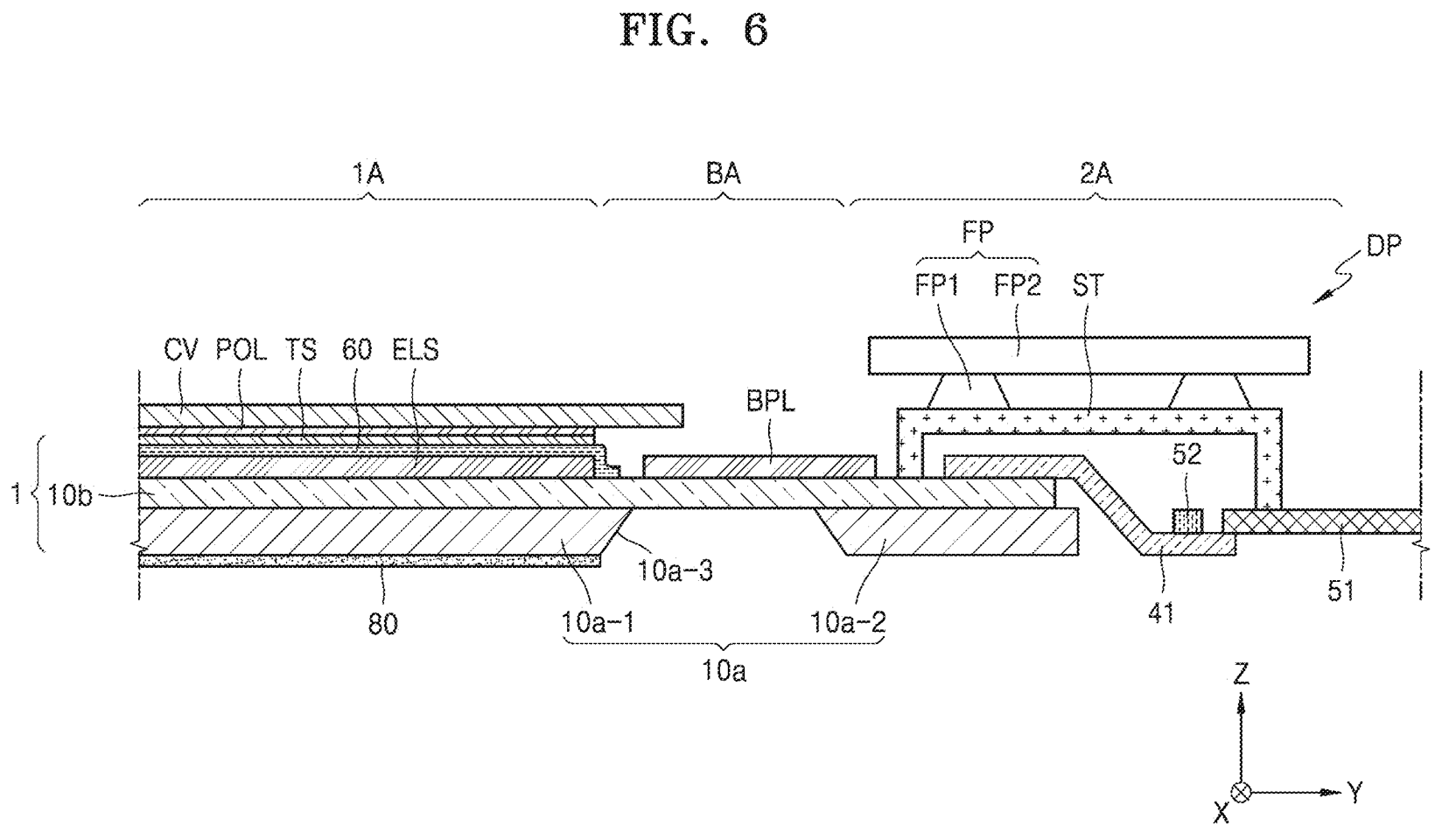
Figure 7:
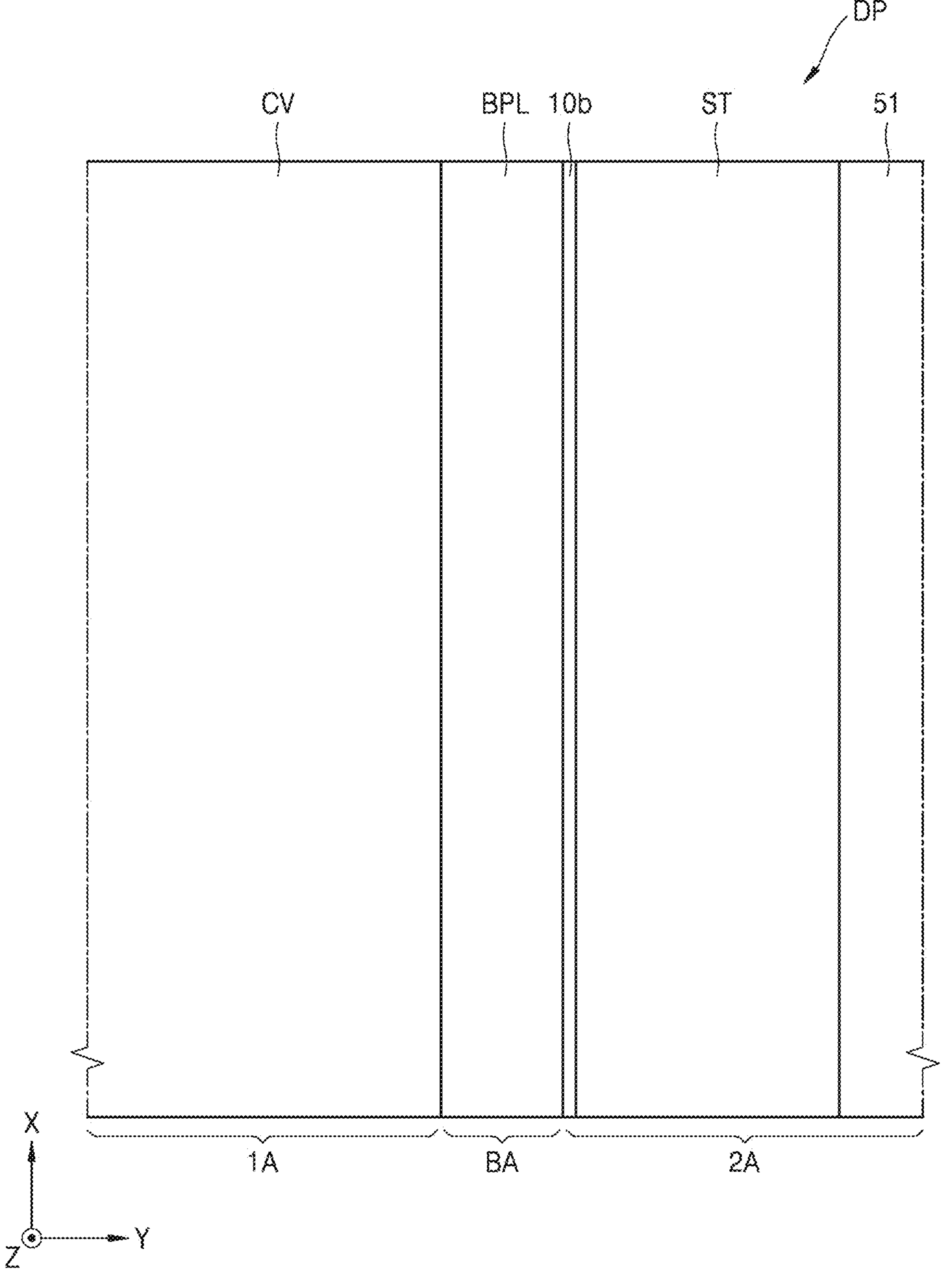
FIG. 7 is a schematic plan view of a display device according to an embodiment.

FIG. 6 is a schematic cross-sectional view of a display device DP according to an embodiment and FIG. 7 is a schematic plan view of the display device DP according to an embodiment.

Specifically, FIG. 6 illustrates a state before a bendable area BA of a substrate 10*b* is bent.

In FIGS. 6 and 7, the same reference numerals as those in FIG. 2 denote the same members, and redundant descriptions thereof may be omitted.

Referring to FIGS. 6 and 7, in an embodiment, the display device DP includes a display panel 1, an optical functional layer POL, a cover member CV, a first circuit board 41, a second circuit board 51, a reinforcement portion ST, a display driver 52, a protection member 80, and a fixing portion FP. The fixing portion will be described below with reference to FIG. 9.

The display panel 1 includes a substrate 10*b*, a support substrate 10*a*, a display portion ELS, an encapsulation layer 60, a touch electrode layer TS, and a bending protection layer BPL.

The substrate 10*b* includes a first area 1A, a second area 2A, and a bendable area BA. The first area 1A and the second area 2A are spaced apart from each other. The bendable area BA connects the first area 1A to the second area 2A. For example, the first area 1A, the bendable area BA, and the second area 2A are sequentially arranged in the second direction, such as the Y-axis direction. The bendable area BA is bendable. In an embodiment, the first area 1A, the second area 2A, and the bendable area BA of the substrate 10*b* are all bendable. In an embodiment, only the bendable area BA of the substrate 10*b* is partially bendable. For example, a bending axis extends in the first direction, such as the X-axis direction, that crosses the second direction, such as the Y-axis direction.

The support substrate 10*a* is disposed below the substrate 10*b* and supports the substrate 10*b*. The support substrate 10*a* includes a first support substrate 10*a*-1, a second support substrate 10*a*-2, and an opening 10*a*-3. The first support substrate 10*a*-1 is disposed below the first area 1A and supports the first area 1A of the substrate 10*b*. The second support substrate 10*a*-2 is disposed below the second area 2A and supports the second area 2A of the substrate 10*b*. The opening 10*a*-3 overlaps the bendable area BA of the substrate 10*b*. Due to the opening 10*a*-3 of the support substrate 10*a*, the display device DP can be easily bent in the bendable area BA without damage.

The display portion ELS is disposed on the substrate 10*b*. For example, the display portion ELS is disposed in the first area 1A of the substrate 10*b*. The encapsulation layer 60 is disposed on the display portion ELS. The encapsulation layer 60 is disposed on the substrate 10*b* and shields the display portion ELS. The touch electrode layer TS includes an electrode pattern. The touch electrode layer TS may be disposed on the encapsulation layer 60 in the form of a panel, or may be the electrode pattern stacked on the encapsulation layer 60. The touch electrode layer TS obtains coordinate information according to an external input, such as a touch event.

The bending protection layer BPL is disposed on the substrate 10*b* and includes a flexible material. For example, the bending protection layer BPL is disposed in the bendable area BA of the substrate 10*b*. The bending protection layer BPL can be bent as the substrate 10*b* is bent in the bendable area BA. The bending protection layer BPL prevents the substrate 10*b* from damage when the substrate 10*b* is bent. The bending protection layer BPL includes a polymer resin, such as polyethylene terephthalate (PET) or polyimide (PI).

The optical functional layer POL is disposed on the touch electrode layer TS. The optical functional layer POL reduces the reflectance of externally incident light from the display device DP, and/or increases the color purity of light emitted from the display device DP. In an embodiment, the optical functional layer POL includes a retarder and a polarizer. The retarder may be a film-type retarder or a liquid crystal coating-type retarder and may include a λ/2 retarder and/or a λ/4 retarder. The polarizer may be a film-type polarizer or a liquid crystal coating-type polarizer. The film-type retarder or polarizer includes a stretched synthetic resin film, and the liquid crystal coating-type retarder or polarizer include liquid crystals arranged in an array. Each of the retarder and the polarizer may further include a protection film.

The cover member CV is disposed on the optical functional layer POL. The cover member CV is, for example, an ultra-thin glass (UTG™) or a colorless polyimide (CPI). The cover member CV protects the display panel 1.

The first circuit board 41 is connected to the second area 2A of the substrate 10*b* and includes a flexible film. The first circuit board 41 overlaps the second area 2A of the substrate 10*b* and includes a flexible material. In an embodiment, the first circuit board 41 is bonded to the top surface of the substrate 10*b* by using an anisotropic conductive film. In an embodiment, the first circuit board 41 is bonded to the top surface of the substrate 10*b* by an adhesive. The top surface of the substrate 10*b* faces a direction away from the support substrate 10*a*.

The second circuit board 51 is connected to the first circuit board 41. The second circuit board 51 may be a flexible printed circuit board (FPCB) that is easily bendable, a rigid printed circuit board (PCB) that is rigid and thus substantially not bendable, or a composite PCB that includes both the rigid PCB and the FPCB.

The first circuit board 41 overlaps the second circuit board 51. In an embodiment, the second circuit board 51 is bonded to the top surface of the first circuit board 41 by using an anisotropic conductive film. In an embodiment, the second circuit board 51 is bonded to the top surface of the first circuit board 41 by an adhesive. However, embodiments of the disclosure are not necessarily limited thereto. In an embodiment, the second circuit board 51 is bonded to the bottom surface of the first circuit board 41. The top surface of the first circuit board 41 includes a surface that faces in a direction away from the support substrate 10*a*, and the bottom surface of the first circuit board 41 includes a surface that faces in a direction toward the support substrate 10*a*.

In addition, a touch sensor driver may be bonded to the first circuit board 41 or the second circuit board 51. The touch sensor driver is implemented as an integrated circuit (IC). The touch sensor driver is electrically connected to a touch electrode layer to be described below.

A power supply is additionally disposed on the first circuit board 41 or the second circuit board 51. The power supply supplies driving voltages that drive the pixels, a scan driver, and/or the display driver 52, which are to be described below. The power supply may be integrally provided with the display driver 52. For example, the power supply and the display driver 52 are implemented as a single IC.

In addition, one of the first circuit board 41 or the second circuit board 51 is electrically connected to a main circuit board. The main circuit board includes a main processor that includes a central processing unit (CPU), a graphics processing unit (GPU), a memory, a communication chip, a digital signal processor (DSP), an image signal processor (ISP), and various types of interfaces. For example, the main circuit includes an application processor (AP). For example, the first circuit board 41 is electrically connected to the second circuit board 51 and the second circuit board 51 is electrically connected to the main circuit board, and thus, the first circuit board 41 is electrically connected to the main circuit board.

The reinforcement portion ST connects the second area 2A of the substrate 10*b* to the second circuit board 51 and covers the first circuit board 41. The reinforcement portion ST overlaps the first circuit board 41. The reinforcement portion ST is rigid. For example, the reinforcement portion ST includes at least one of steel use stainless (SUS), PET, graphite, or a copper (CU) material.

One side of the reinforcement portion ST is fixed to the second area 2A of the substrate 10*b* and the other side of the reinforcement portion ST is fixed to the second circuit board 51. In an embodiment, the reinforcement portion ST is bonded to the top surface of the second area 2A of the substrate 10*b* by using an anisotropic conductive film. In an embodiment, the reinforcement portion ST is bonded to the top surface of the second area 2A of the substrate 10*b* by an adhesive. In addition, in an embodiment, the reinforcement portion ST is bonded to the top surface of the second circuit board 51 by using an anisotropic conductive film. In an embodiment, the reinforcement portion ST is bonded to the top surface of the second circuit board 51 by an adhesive. The top surface of the second area 2A of the substrate 10*b* includes a surface that faces in a direction away from the support substrate 10*a*, and the top surface of the second circuit board 51 includes a surface that faces in a direction away from the first circuit board 41.

The reinforcement portion ST is spaced apart from the first circuit board 41. For example, the cross-sectional shape of the reinforcement portion ST has a '⊏' shape, and each end of the reinforcement portion ST is respectively connected to the second area 2A of the substrate 10*b* and the second circuit board 51. Accordingly, the reinforcement portion ST protects the first circuit board 41 from external impacts, etc., and secures space for various components that are disposed on the first circuit board 41.

The display driver 52 receives control signals and power supply voltages and generates and outputs signals and voltages that drive the display panel 1. For example, the display driver 52 is implemented as an IC. For example, the display driver 52 is disposed on the first circuit board 41. For example, the display driver 52 is located between the first circuit board 41 and the reinforcement portion ST and is connected to the first circuit board 41. However, embodiments are not necessarily limited thereto, and in an embodiment, two display drivers 52 are respectively disposed on the top and bottom surfaces of the first circuit board 41.

The protection member 80 is disposed below the support substrate 10*a*. For example, the protection member 80 is bonded to the bottom surface of the first support substrate 10*a*-1. The protection member 80 absorbs external impact and reduces damage to the display panel 1. The protection member 80 may have a single-layer structure or a multilayer structure. In an embodiment, the protection member 80 includes a copper material. In an embodiment, the protection member 80 includes at least one of polydimethylsiloxane (PDMS), thermoplastic polyurethane (TPU), or PET, or includes an elastic material, such as sponges foamed and molded from rubber, urethane-based materials, or acryl-based materials.

Figure 8:
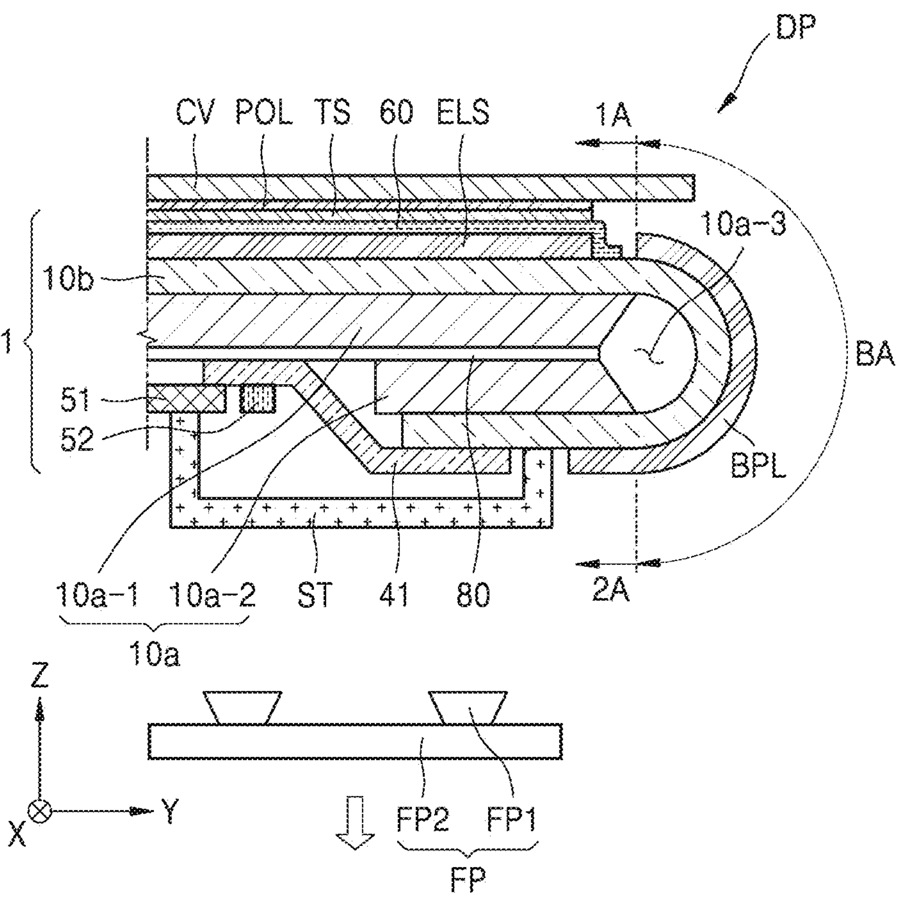
FIG. 8 is a schematic cross-sectional view of a display device according to an embodiment.

FIG. 8 is a schematic cross-sectional view of the display device DP according to an embodiment.

For example, FIG. 8 illustrates a state of the display device DP after the bendable area BA of the substrate 10*b* is bent.

In FIG. 8, the same reference numerals as those in FIGS. 6 and 7 denote the same members, and redundant descriptions thereof may be omitted.

Referring to FIG. 8, in an embodiment, when the bendable area BA of the substrate 10*b* is in a bent state, the protection member 80 is located between the first support substrate 10*a*-1 and the second support substrate 10*a*-2. As the substrate 10*b* is bent, the bending protection layer BPL is also bent and the second support substrate 10*a*-2 is fixed to the protection member 80. For example, both the first support substrate 10*a*-1 and the second support substrate 10*a*-2 are bonded to the protection member 80. In addition, the first circuit board 41 is fixed to the protection member 80 when the bendable area BA of the substrate 10*b* is in a bent state.

Figure 9:
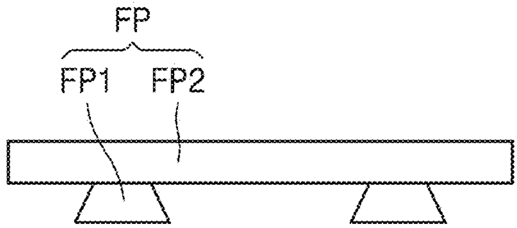
FIG. 9 is a schematic cross-sectional view of a fixing portion according to an embodiment.

FIG. 9 is a schematic cross-sectional view of a fixing portion FP according to an embodiment.

Referring to FIGS. 6 to 9, in an embodiment, the fixing portion FP is fixed to the reinforcement portion ST in a process of bending the substrate 10*b*. The fixing portion FP includes an adsorption portion FP1 and a frame portion FP2. The adsorption portion FP1 includes a vacuum pad and adsorbs the reinforcement portion. For example, the adsorption portion FP1 and the reinforcement portion ST are selectively fixed. A plurality of adsorption portions FP1 may be provided. The adsorption portions FP1 is fixed to the frame portion FP2. The frame portion FP2 supports the adsorption portions FP1. Accordingly, the adsorption portions FP1 do not move relative to each other.

The fixing portion FP is fixed to one surface of the reinforcement portion ST. For example, one surface of the reinforcement portion ST includes a flat surface. For example, the surface of the reinforcement portion ST that faces a direction away from the first circuit board 41 includes a flat surface. For example, the top surface of the reinforcement portion ST includes a flat surface and the fixing portion FP is fixed to the top surface of the reinforcement portion ST. Accordingly, the fixing portion FP is stably fixed to the reinforcement portion ST. After that, the substrate 10*b* can be bent by moving the fixing portion FP. When the bending of the substrate 10*b* is completed, the fixing portion FP is removed from the reinforcement portion ST.

Due to the arrangement of the reinforcement portion ST, a space for fixing the fixing portion FP can be secured. Accordingly, the substrate 10*b* can be stably bent and the precision of the position at which the substrate 10*b* is bent is increased.

According to one or more embodiments, the substrate can be stably bent and the precision of the position at which the substrate is bent is increased.

The effects of the disclosure are not limited to those described above, and other effects that are not mentioned herein will be clearly understood from the description of the claims by those of ordinary skill in the art.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:

a substrate comprising a first area, a second area spaced apart from the first area, and a bendable area that connects the first area to the second area;

a support substrate disposed below the substrate and that supports the substrate;

a display portion disposed in the first area of the substrate;

a first circuit board connected to the second area of the substrate and that includes a flexible film;

a second circuit board connected to the first circuit board; and a rigid reinforcement portion that connects the second area of the substrate to the second circuit board and covers the first circuit board.

2. The display device of claim 1, wherein the reinforcement portion is spaced apart from the first circuit board.

3. The display device of claim 1, further comprising a display driver disposed between the first circuit board and the reinforcement portion and connected to the first circuit board.

4. The display device of claim 1, wherein a cross-sectional shape of the reinforcement portion has a '⊏' shape.

5. The display device of claim 1, wherein one surface of the reinforcement portion includes a flat surface.

6. The display device of claim 1, wherein one side of the reinforcement portion is fixed to the second area of the substrate, and another side of the reinforcement portion is fixed to the second circuit board.

7. The display device of claim 1, wherein the reinforcement portion includes at least one of a steel use stainless (SUS), a polyethylene terephthalate (PET), graphite, or a copper (CU) material.

8. The display device of claim 1, further comprising a bending protection layer disposed in the bendable area of the substrate.

9. The display device of claim 1, wherein the support substrate comprises:

a first support substrate that supports the first area of the substrate;

a second support substrate that supports the second area of the substrate; and an opening that overlaps the bendable area of the substrate.

10. The display device of claim 9, further comprising a protection member that, when the bendable area of the substrate is in a bent state, is arranged between the first support substrate and the second support substrate.

11. A display device, comprising:

a display panel;

a first circuit board connected to the display panel and that includes a flexible film;

a second circuit board connected to the first circuit board; and a rigid reinforcement portion that reinforces the first circuit board, wherein the display panel comprises:

a substrate that includes a first area, a second area spaced apart from the first area and connected to the first circuit board, and a bendable area that connects the first area to the second area;

a support substrate disposed below the substrate and that supports the substrate; and a display portion disposed in the first area of the substrate.

12. The display device of claim 11, wherein the reinforcement portion is spaced apart from the first circuit board.

13. The display device of claim 11, further comprising a display driver disposed between the first circuit board and the reinforcement portion and connected to the first circuit board.

14. The display device of claim 11, wherein a cross-sectional shape of the reinforcement portion has a '⊏' shape.

15. The display device of claim 11, wherein one surface of the reinforcement portion includes a flat surface.

16. The display device of claim 11, wherein one side of the reinforcement portion is fixed to the second area of the substrate, and another side of the reinforcement portion is fixed to the second circuit board.

17. The display device of claim 11, wherein the reinforcement portion includes at least one of a steel use stainless (SUS), a polyethylene terephthalate (PET), graphite, or a copper (CU) material.

18. The display device of claim 11, further comprising a bending protection layer disposed in the bendable area of the substrate.

19. The display device of claim 11, wherein the support substrate comprises:

a first support substrate that supports the first area of the substrate;

a second support substrate that supports the second area of the substrate; and an opening that overlaps the bendable area of the substrate.

20. The display device of claim 19, further comprising a protection member that, when the bendable area of the substrate is in a bent state, is arranged between the first support substrate and the second support substrate.

21. A display device, comprising:

a substrate that includes a first area, a second area spaced apart from the first area, and a bendable area that connects the first area to the second area;

a first circuit board connected to the second area of the substrate and including a flexible film;

a second circuit board connected to the first circuit board; and a rigid reinforcement portion that connects the second area of the substrate to the second circuit board and covers the first circuit board, wherein one side of the reinforcement portion is fixed to the second area of the substrate, and another side of the reinforcement portion is fixed to the second circuit board.

22. The display device of claim 21, further comprising:

a support substrate disposed below the substrate and that supports the substrate;

a bending protection layer disposed in the bendable area of the substrate; and a display portion disposed in the first area of the substrate;

wherein the support substrate comprises:

a first support substrate that supports the first area of the substrate;

a second support substrate that supports the second area of the substrate; and an opening that overlaps the bendable area of the substrate.

* * * * *